US 6,728,280 B1

(12) United States Patent
Tatum et al.

(10) Patent No.: US 6,728,280 B1
(45) Date of Patent: Apr. 27, 2004

(54) APPARATUS AND METHOD PROVIDING A BALANCING LOAD TO A LASER DIFFERENTIAL DRIVE CIRCUIT

(75) Inventors: Jim Tatum, Plano, TX (US); James Kenneth Guenter, Garland, TX (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/803,821

(22) Filed: Mar. 12, 2001

(51) Int. Cl.$^7$ .............................. H01S 5/00; H01S 3/00
(52) U.S. Cl. ................... 372/43; 372/38.02; 372/29.02; 372/38.07; 372/50; 372/29.011; 372/38.01
(58) Field of Search ................................ 372/43, 38.02, 372/29.02, 38.07, 50, 29.011, 38.01

(56) References Cited

U.S. PATENT DOCUMENTS

| | | | |
|---|---|---|---|
| 5,315,606 A | | 5/1994 | Tanaka |
| 5,371,755 A | * | 12/1994 | Murata et al. ............ 372/38.02 |
| 5,488,625 A | | 1/1996 | Nakamori et al. |
| 5,572,540 A | * | 11/1996 | Cheng ......................... 372/50 |
| 5,574,738 A | | 11/1996 | Morgan |
| 5,598,040 A | | 1/1997 | Markis |
| 5,748,653 A | * | 5/1998 | Parker et al. ................. 372/8 |
| 5,764,667 A | | 6/1998 | Luque |
| 5,987,045 A | * | 11/1999 | Albares et al. ............... 372/38 |
| 6,038,243 A | * | 3/2000 | Mogi ........................ 372/50 |
| 6,389,049 B2 | * | 5/2002 | Yoshida et al. .......... 372/38.02 |
| 6,532,245 B1 | | 3/2003 | Paschal et al. |

OTHER PUBLICATIONS

International Search Report, dated Jul. 11, 2003, relative to PCT application No. PCT/US 02/07324, the foreign equivalent to the instant U.S. application 09/803,821.

Jim Tatum, "VCSEL Packaging for Data Communication Transceiver Design", article in "Fiber Optic Product News" magazine, published Jul. 2000.

Methode Electronics, Inc., "MDX–19–5–1–X–X Optical 1X9 HIPPI Serial Transceiver", product specification 9257.01 / OE8608–8145, copyright 1985 Methode Electronics, Inc., Chicago, Illinois.

Sun Microsystems, Inc., "Fibre Channel versus Alternative Storage Interfaces—An Overview Technical Brief", white paper in "Network Storage Solutions" internet site www.sun.com/white–papers, Aug. 18, 2000, copyright 1994–2000.

Dell Computer Corporation, "Fibre Channel Drives", technical paper in "Higher Education" internet site www.dell.com/us/en/hied/topics/products_tech_pvaul_0001_fc_tech.htm, Aug. 18, 2000, copyright 1999–2000.

Gigabit Ethernet Alliance, "Gigabit Ethernet, Accelerating the Standard for Speed", product specification, copyright 1997, Cupertino, California.

* cited by examiner

Primary Examiner—George Eckert
Assistant Examiner—Joseph Nguyen
(74) Attorney, Agent, or Firm—Andrew A. Abeyta (57) ABSTRACT

A die having a semiconductor laser driven by a differential drive circuit is provided. The die provides a matched load to the drive circuit by also having a balancing load with an impedance, including both resistive and reactive components substantially identical to the load impedance of the semiconductor laser fabricated on the die. With the balancing load and semiconductor laser pair, the die prevents impedance-mismatch-induced drive problems that occur in high frequency operation, e.g., above about 1 GHz. The semiconductor laser may be a vertical cavity surface emitting laser (VCSEL), for example, as are used in high bandwidth applications like Gigabit Ethernet and Fibre Channel Applications. Furthermore, the die can form an array of balancing and semiconductor laser pairs.

24 Claims, 4 Drawing Sheets

APPARATUS AND METHOD PROVIDING A BALANCING LOAD TO A LASER DIFFERENTIAL DRIVE CIRCUIT

BACKGROUND OF THE INVENTION

The present invention relates generally to semiconductor laser dies and, more particularly, to a die having a vertical cavity surface emitting laser ("VCSEL") and providing a balanced output to a drive circuit for optimally driving a VCSEL.

Semiconductor lasers are employed in numerous applications such as pumping solid state lasers, forming laser arrays, serving as sources for optical pick-up in compact disc (CD) players, and coupling to optical fibers in optical communications applications. Traditionally, the most common form of semiconductor laser has been the side or edge-emitting laser, though more recently VCSELs have been used in the above applications and indeed have become the dominant laser source in numerous data communications applications.

In contrast to the edge-emitting laser, in which the active region is positioned within a resonance cavity defined by two reflective layers positioned at opposing sides of the active region, VCSELs, in one form, have a resonance cavity defined by two reflective layers positioned at the top and bottom of the active region to produce a vertical emission, i.e., an emission normal to the junction plane of the active region. The junction plane may be a plane defined by the intersection of an AlGaAs layer and a GaAs layer in a multi-quantum well VCSEL structure, for example. In sum, edge-emitting lasers have a resonance cavity parallel to the junction plane and an emission through the side of the laser, while VCSELs have a resonance cavity orthogonal to the junction plane and emit through a surface of the laser.

Biasing a VCSEL is achieved through contact layers in the form of thin metal layers, where the contact layers, being photo-opaque (i.e., photon absorbing, over the emission spectrum of VCSELs), are positioned at specific locations on the top and bottom of a layered semiconductor structure surrounding the active region. For example, designs include a first metal contact layer over the entire bottom surface of the semiconductor substrate (i.e., between the semiconductor laser and a mounting substrate) and a second metal contact layer that is disposed either over half of the upper surface of the semiconductor substrate, only at a corner of the upper surface, or over all but an emission window of the top surface of the semiconductor laser. Still other designs use the bottom surface of the semiconductor laser as an emission surface with the mounting substrate upon which the VCSEL is mounted being photo-transparent.

In another form known in the art, a vertically-emitting laser is created from an edge-emitting semiconductor laser with an external cleaved surface angled at 45 degrees to the junction plane in the active region. Using materials with a high reflectivity over the principal wavelength(s) emitting from the lasing region, the cleaved surface reflects vertically the horizontally emitted light from the edge of the lasing region. This forms a surface-emitting laser, but without a vertical cavity. More recently, tunable VCSELs that use MEMs (micro-electro-mechanical-structures) to mechanically move the upper reflective region with respect to the active region have been shown. By lengthening or contracting the resonance cavity, one can tune the resonating wavelength of the coherent photonic emission for such VCSELs.

VCSELs have become the dominant laser source in demanding optical data communications systems like the Gigabit Ethernet standard provided for in the IEEE 802.3z protocol and the Fibre Channel standard provided in the ANSI X3.T11 protocol. VCSELs are preferred because they have high modulation bandwidths and can produce high bit transmission rates.

The Gigabit Ethernet standard is designed to improve upon the Ethernet (10 Mbps) and Fast Ethernet (100 Mbps) standards by providing a way to transmit and receive large amounts of data at data rates of 1 Gbps. The Gigabit Ethernet standard is intended for use in such demanding applications as scientific modeling, data warehousing, data mining, internet/extranet access, backing-up networks, and high-quality video conferencing. The Gigabit Ethernet standard achieves higher bandwidth while maintaining the simplicity and the relatively low cost of implementation and maintenance associated with the now-entrenched Ethernet standard. Providing higher bandwidth using low-cost components has made the Gigabit Ethernet standard attractive. With a large percentage of the installed network connections being Ethernet based, the Gigabit Ethernet standard has the advantage of backward compatibility with existing Ethernet backbones, as well. For example, all three Ethernet standards (Ethernet, Fast Ethernet, and Gigabit Ethernet) use the same IEEE 802.3 frame format. An additional feature of the IEEE 802.3z protocol is that it allows for full and half-duplex operation.

Fibre Channel, the ANSI X3.T11 protocol, is used in data storage and access systems in lieu of Small Computer System Interface (SCSI) systems. SCSI systems use an individual SCSI controller for each storage device (e.g., a hard drive) connected to a network. The separate parallel connections that result consume space and, as more storage devices are connected, decrease the I/O processing efficiency of the system, with SCSI applications typically having throughput speeds of less than 100 Mbps. The Fibre Channel standard allows serial I/O connection of numerous devices to a single input of a data processor or server and can achieve throughput in excess of 1 Gbps, and the serial nature of the Fibre Channel standard allows hot-plug connection of storage devices "on the fly", e.g., without taking the system offline. The Fibre Channel standard also allows access to devices many meters from the processor or server because of the use of optical fiber in place of the copper cable used in SCSI applications.

VCSELs, serving as optical signal sources for these and other optical fiber-based data communication applications, are preferred over edge-emitting lasers for numerous reasons, one reason being the beam shape of the output. The beam shape of the output of the edge-emitting lasers looks approximately like the cross-sectional shape of the active region: the beam shape is elliptical. In contrast, the beam shape of the output of a VCSEL is approximately circular, matching the circular shape of the emission window defined by the upper contact layer and the active region, which produces a uniform photon emission across this window. The output of a VCSEL also has a low numerical aperture. Both of these properties make fiber coupling (in particular single-mode fiber coupling) easier with a VCSEL than with an edge-emitting laser. With a circular beam shape, the VCSEL output can be focused into a single mode optical fiber, using a known ball lens, for example, thus reducing undesirable multimode optical-fiber losses such as intermodal dispersion.

Furthermore, VCSELs are characterized by high power conversion efficiency, even in low input power ranges, and provide wide small-signal modulation bandwidths, with modulation bandwidths in excess of 1 GHz. Both of these advantages demonstrate the ability of VCSELs to be used in Gigabit Ethernet and Fibre Channel applications at a relatively low drive current and, thus, with less power usage and less thermal loss.

Moreover with the vertical emission, VCSELs can be relatively easily packaged, often with a photodetector disposed at the back surface of the VCSEL (or within the substrate upon which the VCSEL is mounted) for power monitoring and feedback control. More recently, VCSELs have been packaged in a transceiver for use in duplex communication.

VCSEL active region layers are deposited by known techniques and are doped to form PN junctions, PIN junctions with an intrinsic layer disposed between the p-type and n-type layers, or double heterostructures. Furthermore, VCSELs have relatively fast transition times, e.g., the VCSEL output can be driven from a binary "0" state to a binary "1" state in a relatively short period of time. Therefore, VCSELs are able to achieve wide modulation bandwidths, with transmission rates of between 1 and 10 Gbps achievable. Moreover, VCSELs have been designed to operate at wavelengths desirable for optical fiber transmission, such as 850 nm with multimode optical-fibers and 1270–1600 nm with single mode optical-fibers.

Though VCSELs are commonly used, the demands for increased bandwidth and better signal integrity in gigabit data communication environments like Gigabit Ethernet and Fibre Channel suggest a need for more efficient, cleaner, and non-interfering VCSEL operation. Part of these demands result from the increased functionality of the gigabit communication environment, where, for example, the challenge of making smaller components, particularly smaller PCBs (printed circuit boards) in optical transceivers, has resulted in smaller, more confined opto-electronic components. These smaller configurations, however, increase the potential for crosstalk between fibers. Furthermore, electromagnetic interference (EMI) is also increased due to the short distances between the closely spaced opto-electronic drive circuit components.

In addition to these considerations, current drive circuits do not provide clean input signals to the VCSEL at high frequencies. Analyzing the electrical characteristics of a VCSEL shows that the impedance of the VCSEL, which is essentially resistive at lower drive frequencies, varies greatly at higher drive frequencies, especially above 1 GHz, i.e., the driving frequencies in Gigabit Ethernet and Fibre Channel applications. In fact, when analyzing the impedance of a VCSEL die chip and the accompanying packaging or housing of the VCSEL, for example a known TO packaging arrangement, the electrical parasitic effects from the package and from the die result in an even more pronounced frequency dependence of the impedance seen by the drive circuit. That is, VCSEL packaging adds to the non-linearity of VCSEL operation at high frequencies. In short, as an active circuit element, the VCSEL has an impedance that varies substantially with frequency and which in turn results in a non-linear load for the VCSEL drive circuit, particularly over high frequency operation.

To achieve relatively low drive currents, and thereby provide relatively low power demands for use in Ethernet switches, routers, hubs, end-user connections, etc., drive circuits for VCSELs, or any semiconductor laser for that matter, typically have a differential amplifier configuration that includes at least two transistors in a common emitter or common collector configuration. In the Ethernet or Fibre Channel environment, differential signaling is commonly used to reduce EMI and maintain electrical signal integrity. This design philosophy is continued inside the laser drive, where the input digital differential signal is converted to an analog laser drive current.

The cleanest electrical signal is typically obtained with a pair of transistors in a differential mode, operating either as common collector or common emitter.

The VCSEL is connected to the drive circuit in one of two driving modes. First, the VCSEL may be operated in a single-ended mode in which the laser is connected between the output of one of the transistors and ground. In this configuration, the output of the second transistor of the differential amplifier pair is matched to the output of the VCSEL through the use of a resistive element connected to the output of the second transistor. The resistive element resides either on the differential amplifier circuit or the PCB and approximates the low frequency impedance of the VCSEL.

Second, the VCSEL laser may be operated in a differential drive mode in which the VCSEL laser is connected between the output of both transistors. This mode has the advantage of lower voltage swings in response to abrupt changes in the signal current. Compared to the single-ended drive mode, the differential drive mode produces faster rise times, e.g., transitions from a "0" state to a "1" state, with less overshoot. However, differentially driving the VCSEL can be problematic because of the potential asymmetry introduced by injecting carriers into both the N and P side of the junction. As the speed of operation increases, this asymmetry leads to reduced optical performance.

The single-ended drive mode suffers from an impedance-matching problem resulting from the reactive component of the impedance of the VCSEL. With the impedance seen by the differential amplifier depending on numerous factors, e.g., shape of the VCSEL, drive current, shape and size of wire bond pads and wire leads, it is difficult to ensure that the optimum waveform is provided to the VCSEL or that the output from the VCSEL will be at the highest bit rate possible.

This difficulty has presented a problem to manufacturers who have, thus far, used resistors as "matching" loads in single ended drives. Resistors provide a relatively acceptable matching of the low-frequency impedance of the VCSEL and, being non-reactive circuit elements, do not contribute to the electrical parasitics in the drive circuit. A number of problems result from using these resistors, however.

One problem is that, though VCSELs are batch manufactured from cutting out individual lasers from a semiconductor wafer, individual VCSELs vary in impedance characteristics, both within a wafer and in wafers manufactured at different times. Matching a load in the differential amplifier circuit with the load impedance of a VCSEL requires individual testing of the impedance characteristics of the particular VCSEL being driven, a time-consuming and expensive endeavor.

Another problem exists in that VCSELs have a frequency dependent impedance. The reactive component of the VCSEL impedance varies greatly with the frequency of the driving current, such that at high frequency, e.g., GHz frequencies, the mismatch between the impedance of the VCSEL and the resistor impedance is substantial. For example, the inductance of a VCSEL is on the order of 1 nH, and the capacitance is on the order of 1 pF. The current injection efficiency into this load at speeds varying from 1–10 GHz can be decreased by more than 50%, resulting in poor optical performance. Distortion of the waveform to the VCSEL results from the mismatch, as the output waveform may show overshoot on the rising edge of the output (the "0" to "1" state transition) and a slower trailing-off of the falling edge (the "1" to "0" state transition) when compared to the waveform input to the drive circuit.

Therefore, it is desirable to have a more closely matched load for use with differential drive circuitry used in VCSELs, or any semiconductor laser, and it is desirable to create such a more closely matched load in a convenient and economical manner.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

In accordance with an aspect of the present invention, a die having a semiconductor laser disposed thereon and having a balancing load disposed thereon is provided. The balancing load has an impedance, including both resistive and reactive components, that is matched to a load impedance of the semiconductor laser.

In some embodiments, the semiconductor laser is a VCSEL, and in some of such embodiments the balancing load is a VCSEL, whereby the output of the balancing load VCSEL is blocked so as not to interfere with a signal output from the semiconductor laser VCSEL.

In some embodiments, the die has a plurality of semiconductor lasers and a plurality of balancing loads, where for each semiconductor laser there is at least one balancing load having an impedance, including both resistive and reactive components, matched to the load impedance of that semiconductor laser.

In some embodiments, the impedance of the balancing load is substantially identical to the impedance of the semiconductor laser for frequencies on the order of about 1 GHz.

In some embodiments, the die is used in a laser package, which includes a header base and a housing having a housing window.

In accordance with another aspect of the present invention, an apparatus comprising a drive circuit, a VCSEL coupled to the drive circuit, and a balancing load coupled to the drive circuit is provided. The balancing load has an impedance matched to an impedance of the VCSEL at frequencies on the order of about 1 GHz.

In some embodiments, the impedance of the VCSEL is substantially identical to the impedance of the balancing load at frequencies on the order of about 1 GHz.

In some embodiments, the drive circuit comprises a differential amplifier, where a first output stage comprises a first transistor connected to the VCSEL and a second output stage comprises a second transistor connected to the balancing load. In further embodiments, the first output stage includes a first reactive circuit block connected to the first transistor and the second output stage includes a second reactive circuit block connected to the second transistor. In even further embodiments, the first reactive circuit block and the second reactive circuit block have substantially the same impedance at frequencies on the order of about 1 GHz.

In some embodiments, the apparatus has a plurality of VCSELs coupled to the drive circuit and a plurality of balancing loads coupled to the drive circuit, forming a laser array where for each VCSEL there is at least one balancing load having an impedance, including both resistive and reactive components, matched to the load impedance of that VCSEL.

In accordance with another aspect of the present invention, a method of using a first VCSEL with a balanced load drive circuit having a first differential amplifier and a second differential amplifier is provided. The method includes (1) forming the first VCSEL on a die substrate, (2) forming a second VCSEL of substantially identical shape and size as the first VCSEL on the die substrate, (3) masking the emission window of the second VCSEL, and (4) connecting the drive circuit to the first VCSEL via the first differential amplifier and connecting the drive circuit to the second VCSEL via the second differential amplifier, so that a selectively balanced load is present at the output stages of the amplifiers.

In some embodiments the forming of the second VCSEL further comprises forming the second VCSEL so that an impedance of the second VCSEL is substantially identical to an impedance of said first VCSEL at frequencies on the order of about 1 GHz.

In accordance with another aspect of the present invention, a method of forming a laser array having a plurality of VCSELs disposed thereon is provided. The method includes (1) selectively forming half of the plurality of VCSELs to each have an emission window exposed for vertical output; (2) selectively forming the other half of the plurality VCSELs such that the outputs from these VCSELs are masked; and (3) pairing each one of the first half of the plurality VCSELs to a corresponding one of each one of the second half of the plurality of VCSELs to form first and second VCSEL pairs and connecting a drive circuit to each pair so that the drive circuit sees a balanced load when driving the corresponding VCSEL pair.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

It should be understood that the drawings are not necessarily to scale and that the embodiments are illustrated using graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PREFERRED EMBODIMENT

Figure 2:
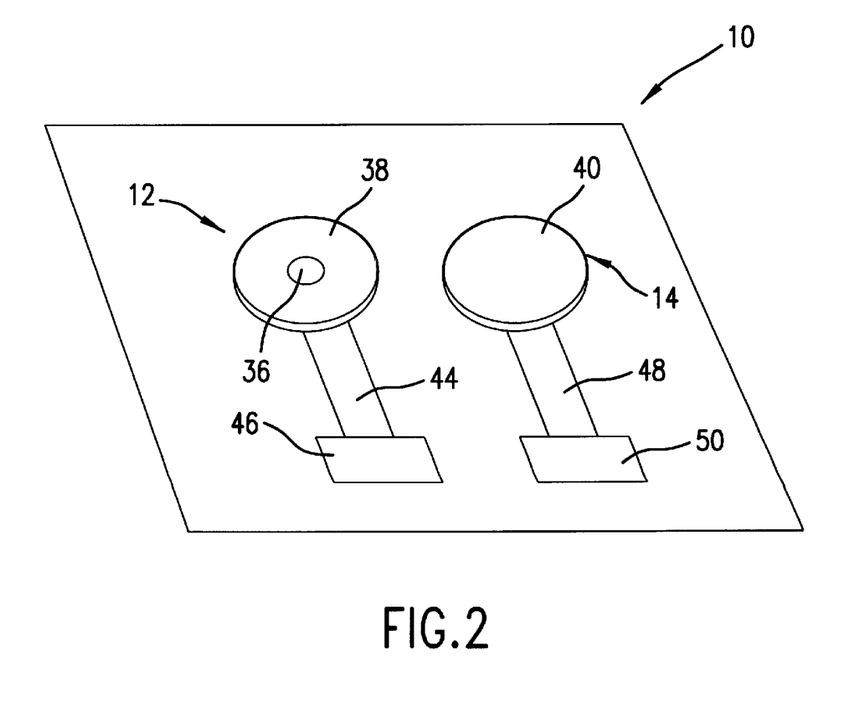
FIG. 2 is a perspective depiction of a die with a VCSEL and a balancing load in accordance with the teachings of the present invention.

In accordance with an embodiment of the present invention, a die 10 having a VCSEL 12 and a balancing load 14 that matches the impedance of the VCSEL 12 over a broad range of drive frequencies is disclosed in FIG. 2. As will be apparent from the following description, the die 10 can be used in numerous applications as a source of laser light, such as in wide bandwidth data communications applications. Further, the die 10 is an improvement of the prior art addressing one or more of the problems thereof, as described above, including providing a balanced load to a circuit driving the VCSEL 12 at frequencies above 1 GHz. Given the below disclosure, however, persons of ordinary skill in the art will recognize that the die 10 can be used in other applications. Additionally, persons of ordinary skill in the art will recognize that the use of VCSEL 12 on the die 10 in the present invention, is by way of example, not limitation, and that the present invention extends to the use of other active loads, such as edge-emitting semiconductor lasers, with a balancing load such that both the active load and the balancing load collectively provide a matched output as seen by a driving circuit.

VCSELs are typically driven by two-output stage drive circuits in either (1) a differential drive mode or (2) a single-ended drive mode. As stated above, the singled-ended drive mode is preferred because, in the differential drive mode, the current path from the output of the drive circuit is different for each of the two output stages, thereby resulting in a difference in the waveform seen at the VCSEL. This drawback is particularly problematic because, in both the differential drive mode and the single-ended drive mode, the drive circuit receives an inverted input and an identical non-inverted input, with one input provided to one of the output stages and the other input provided to the other. In the differential drive mode, however, although each output stage receives an input which is an inverted duplicate of the input to the other output stage, the output of one stage sees a different current path than the output of the other stage. Thus, the output signals that drive the VCSEL are not identical and inverted at the VCSEL, as are the input signals to the VCSEL drive circuit.

Figure 1:
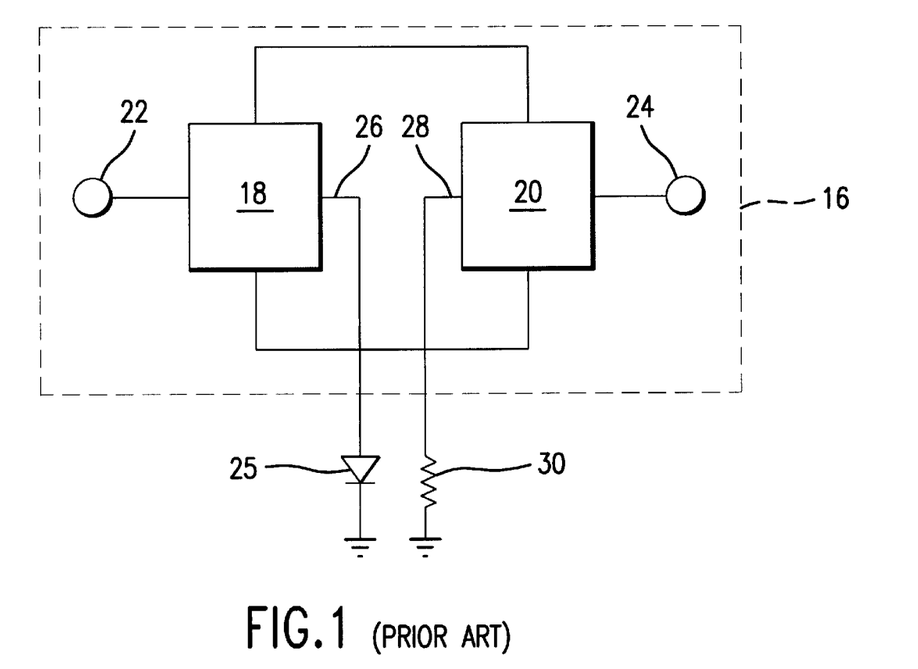
FIG. 1 is a circuit diagram of a drive circuit for driving a VCSEL.

To address this shortcoming, a drive circuit 16 as shown in FIG. 1 is commonly used in the prior art. The drive circuit 16 is only generally shown, and persons of ordinary skill in the art will recognize that additional functional elements, including active elements like amplifiers and additional voltage sources like a DC voltage source, may be commonly employed. The drive circuit 16 has two circuit blocks 18, 20 which function to amplify the input received from inputs 22, 24, respectively. In FIG. 1, the inputs 22, 24 may receive both a DC biasing component for maintaining a VCSEL 25 (shown as a diode in FIG. 1) above the laser threshold and an AC signal component for providing a signal to be transmitted by the VCSEL 25. Input 22 may receive one input signal, while input 24 may receive a duplicate inverted input signal.

Two output stages 26, 28 are provided in the drive circuit 16, one for each of the circuit blocks 18, 20. In the single-ended drive mode, as shown in FIG. 1, one output stage, for example output lead 26, is connected to the VCSEL 25, while the other output stage, for example output lead 28, is connected to a resistor 30, which is chosen to "balance" the load of the VCSEL 25. Both the VCSEL 25 and the resistor 30 are connected to ground, as indicated.

In the prior art, the resistor 30 is chosen to have an impedance that "matches" the impedance of the VCSEL 25, i.e., have an impedance approximately the same as the low frequency impedance of the VCSEL 25. It is desirable to "match" both output stages 26, 28 to one another to provide a clean waveform to the VCSEL 25. Mismatched impedances seen by each output stage 26, 28 result in error on the waveform sent to the VCSEL 25.

Though the resistor 30 of the prior art is chosen to "match" the impedance load of the VCSEL 25, the VCSEL 25 is a load with a reactive impedance component, i.e., an impedance that varies with drive frequency. Thus, the resistor does not exactly match the impedance of the VCSEL 25, but instead only approximates that impedance for lower frequencies of operation. The mismatch between the impedance of the resistor 30 and the VCSEL 25, especially at GHz frequencies, results in error on the waveform supplied to the VCSEL 25. This error is in the form of a slow rise time on "0" to "1" transitions and overshoots at the front end of the output pulses.

With the drive circuit 16 formed on a PCB, the lead (not shown) extending from the output stage 26 to a package in which the VCSEL 25 is mounted acts like a single transmission line radiator element radiating RF frequencies. Thus, the non-inverted signal from the input 22 travels much farther than the inverted signal from the input 24, which extends only to the resistor 30 that is on the PCB of the drive circuit 16.

FIG. 2 depicts an embodiment of the present invention that provides a solution to the shortcomings of the prior art shown in FIG. 1 and discussed above. The die 10 has a substrate formed of a semiconductor material that is easily machinable, or cut, into a rectangular shape, as provided, or any other shape suitable for mounting the die 10 into a package, like a commonly used TO package. The VCSEL 12 and the balancing load 14 are disposed on the top surface of the die 10 and can be formed on the top surface via a growth technique, such as metal-organic-chemical-vapor-deposition (MOCVD), with masking and etching steps to form the actual structures. In the present embodiment, the VCSEL 12 has an active region formed by a p-type layer and an n-type layer (neither shown) disposed between two reflective layers (also not shown). The reflective layers can be formed by alternating layers of ¼ wavelength, or multiples thereof, Bragg reflectors like alternating layers of GaAs/AlAs, and other suitable reflective layer methods could also be used. The VCSEL 12 has an output window 36 in the center of an upper contact layer 38 that is formed from a thin metallic layer.

In the preferred embodiment, the balancing load 14 is identical to the VCSEL 12 in that it has the same layered structure, layer thickness, and cross-sectional shape from a plan view and is designed to have essentially the same electrical and optical properties, e.g., impedance, quantum efficiency, laser threshold, and high frequency characteristics. Thus, one advantage of the die 10 is that it can be easily using known techniques for growing VCSELs. Both the VCSEL 12 and the balancing load 14 could be batch manufactured on the same wafer (not shown) with the wafer being machined, or cut, into a plurality of separate dies 10. In essence, the balancing load 14 is a second VCSEL disposed on the die 10 and is fabricated identically to the VCSEL 12 so as to ensure that the balancing load 14, which (as explained below) replaces the resistor 30 of the prior art single-ended drive apparatus, and preferably has an impedance, including both resistive and reactive components, that is identical to the impedance of the VCSEL 12.

By way of example, and not limitation, to prevent the balancing load 14 from producing an output signal that interferes with the output from the VCSEL 12, an upper contact layer 40 completely covers the upper surface of the balancing load 14. Thus, though the balancing load 14 is formed from an identical structure as the VCSEL 12, the balancing load 14 does not have an emission window from which photons can escape the resonance cavity. Photons are absorbed into the opaque upper contact layer 40, formed from a thin metal layer. When driven by a drive circuit with two output stages, the balancing load 14 appears to be an identical load, having an identical impedance even at frequencies over 1 GHz, but without producing any interfering photonic output. Persons of ordinary skill in the art will recognize that other means of blocking the photonic emission from the balancing load 14 can also be used, including external absorption structures, and that such means are within the scope and spirit of the present invention.

Figure 3:
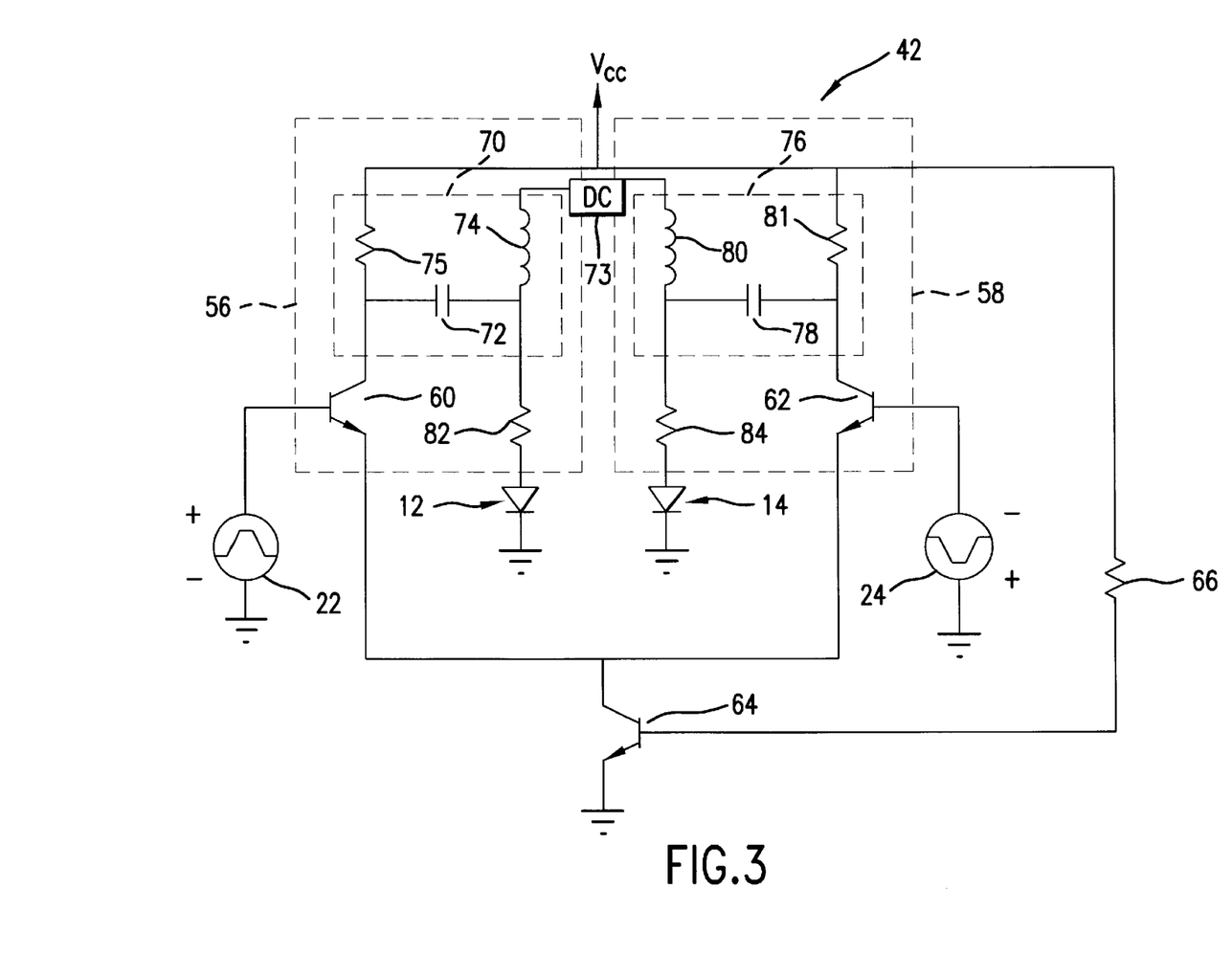
FIG. 3 is a circuit diagram of the VCSEL and balancing load of FIG. 2 being driven by a differential drive circuit, in accordance with the teachings of the present invention.

Referring to FIG. 3, the VCSEL 12 can be connected to an external drive circuit 42 by a contact lead 44 extending from the bottom surface of the VCSEL 12 to a wire bond pad 46. The contact lead 44 makes electrical contact with the bottom electrode (not shown) of the VCSEL 12 and can be formed of a thin metal layer, along with the wire bond pad. The balancing load 14 is disposed with a similar contact lead 48 and a wire bond pad 50. The contact lead 44 and bond pad 46 form a contact path for the VCSEL 12.

The die 10 of FIG. 2 can be connected to the drive circuit 42 through the wire bond pads 46, 50, with upper contact layers 38, 40 being connected to ground or vice-versa. FIG. 3 shows a circuit diagram of the VCSEL 12 and the balancing load 14 connected to the drive circuit 42. The drive circuit 42 is configured as a differential amplifier, with a first output stage 56 and a second output stage 58 connected to the VCSEL 12 and balancing load 14, respectively. The output stage 56 has a transistor 60 connected (at its base) to the non-inverted input 22, and the second output stage 58 has a transistor 62 connected (at its base) to the inverted input 24. In this configuration, the drive circuit 42 operates in a single-ended drive mode. The two transistors 60, 62 are connected in a common emitter configuration, though the drive circuit 42 can be straightforwardly adapted to a common collector configuration. The drive circuit 42 receives a DC supply voltage via $V_{CC}$ as shown. The two transistors 60, 62 are turned on by the $V_{CC}$ input to the base of a third transistor 64 through a resistor 66.

A reactive circuit block 70, comprising a capacitor 72 that blocks the DC signal output and passes the AC signal output to the VCSEL 12 and an inductor 74 that passes a DC signal from a DC current source 73 and blocks the AC signal from entering the VCSEL 12, is connected to the collector of the transistor 60. A resistor 75 is also provided. A similar reactive circuit block 76 with a capacitor 78, an inductor 80 and a resistor 81 is connected to the collector of the transistor 62. Persons of ordinary skill in the art will recognize various means of implementing the circuitry necessary to create the DC current source 73. The DC current source 73 is not a part of the circuit blocks 70, 76 or output stages 56, 58 in the preferred embodiment.

To provide an ideally matched output from the first output stage 56 and from the second output stage 58, the capacitors 72, 78 are chosen to be identical or substantially identical in value and the inductors 74, 80 are chosen to be identical or substantially identical in value. However, as explained below, it may be desirable to adjust these values depending upon the desired input waveform to the VCSEL 12 and/or depending upon the mismatch in impedance between the VCSEL 12 and the balancing load 14. Each output stage 56, 58 further comprises a resistor 82, 84, respectively, which serves to buffer the impedance of the system to 50 ohms.

In operation, a signal from input 22 is transmitted to the transistor 60 and an identical, but inverted, signal is transmitted to the transistor 62. In Gigabit Ethernet and Fibre Channel applications, for example, this signal could include data to be communicated in a network environment, such as video data, a large data file, or the like, and in such applications, the signal would appear as a series of pulses, e.g., transitions between a "0" state and a "1" state, representing digital data.

Unlike the prior art, in an embodiment of the present invention, the non-inverted signal from the input 22 and the inverted signal from the input 24 see the same impedance path, i.e., the waveform at the balancing load 14 is received through a current path which is equivalent to the current path passed through by the waveform at the VCSEL 12. Note also that in this form (1) the contact leads 44, 48 have the same dimensions and, thus, the same inductance and (2) the wire bond pads 46, 50 have the same dimensions and, thus, the same capacitance. The matching of the load on the output stage 58 to the load on the output stage 56 results in better electrical-to-optical efficiency and a cleaner output from the VCSEL with reduced rise time and fall time in transitions between a "0" state and "1" state, as well as reduced overshoot and undershoot at the lead edge of a transition when compared to known single-ended drive modes. These improvements allow for faster bit transmission rates, where bit transmission rates are inversely proportional to the rise and fall times of a transition. The improvement in reduced overshoot and undershoot in a transition is particularly beneficial in ensuring that the drive current for the VCSEL 12 does not drop below the threshold current for the laser.

The matched load seen by the drive circuit 42 also has the advantage that EMI is reduced. EMI is particularly noticeable in the prior art singled-ended drive mode of differential amplifiers where the load is connected via an electrical lead connected to an output stage of the differential circuit. This lead, which can be as long as leads 94, 96, 98, 100 of FIG. 4, and the load connected thereto act as a miniature RF radiator or antenna, thus producing detrimental EMI. The drive circuit 42 addresses this problem by providing an identical inverted input signal through input 24 to the balancing load 14 along a transmission line of equal length to that of the VCSEL 12 (see FIG. 4 and description below). The reduction of EMI helps to maintain class B operation of network systems, a FCC requirement. Also, EMI reduction helps to reduce susceptibility to electrical crosstalk and reduces the potential for bit errors.

Given the foregoing description, persons of ordinary skill in the art will recognize that the balancing load 14 need not necessarily have an impedance exactly balanced with the impedance of the VCSEL 12. Instead, a slight imbalance between the impedance at the output stage 56 and the impedance at the output stage 58 is permissible, and this slight imbalance is also encompassed in the term "matched" used herein. For example, imbalance may be desirable to shape the waveform seen at the VCSEL 12 for optimum performance. In either the exactly identical or substantially identical case, the balancing load 14 of die 10 will result in substantial improvement because of the reduction in waveform error due to the frequency dependent impedance mismatch of the prior art.

Figure 4:
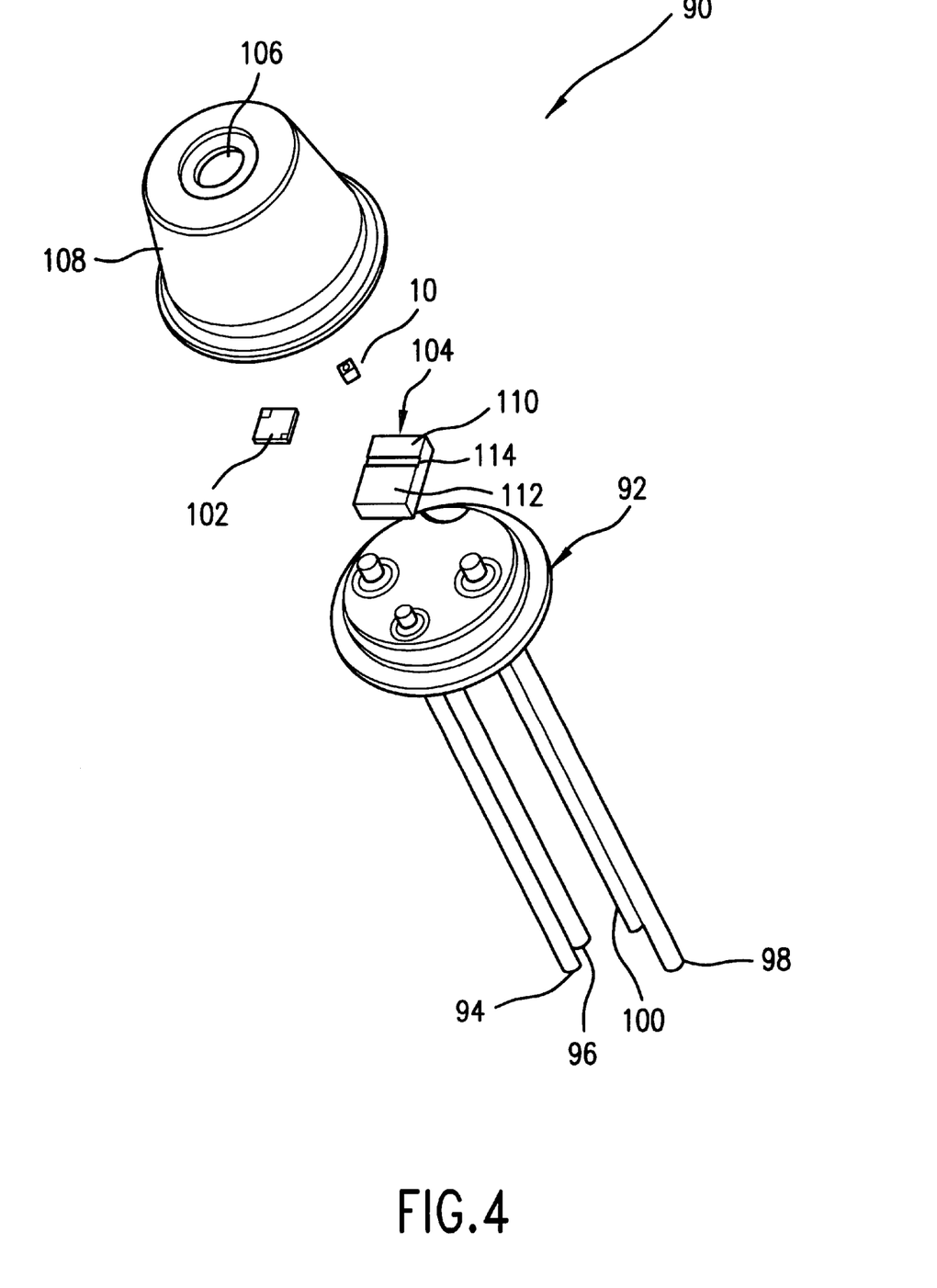
FIG. 4 is a perspective depiction of an unassembled laser package having the die of FIG. 1, in one exemplary use.

Electrical parasitics result from varying influences within the opto-electronic components in a VCSEL package (FIG. 4). The contact leads 44, 48, the wire bond pads 46, 50, the capacitive affects resulting from the upper contact layers 38, 40 (FIG. 2), and the corresponding lower contact layers across the VCSEL may all create electrical parasitic effects. Furthermore, electrical parasitic effects may result from the packaging that houses the VCSEL 12 and balancing load 14. All of these may affect the impedance and, thus, the waveform received at the VCSEL 12. With these varying sources of electrical parasitics, and applying the novel teachings and disclosure herein, it may be desirable to create an imbalance in the impedance seen by the output stage 58 from that seen by the output stage 56 as compensation therefor. Tests may be performed to determine the ideal operating impedance of the balancing load 14 in comparison to the impedance of the VCSEL 12.

Though persons of ordinary skill in the art will appreciate the myriad ways in which testing for optimum VCSEL 12 performance may be achieved, one method is to produce a batch of pairs of VCSELs 12 and the balancing loads 14 on a wafer, where, for each pair, the dimensions (preferably the length and width) of the contact lead 48 can be adjusted so as not to be the same as that of the contact lead 44. Correspondingly, the dimensions of the wire bond pad 50 can be adjusted so as not to be the same as that of wire bond pad 46. Adjusting the dimensions of these will affect the impedance characteristics seen by the output stages 56, 58. By producing different VCSEL 12 and balancing load 14 pairs with different unbalancing properties, one can then test for the pair that produces the optimum waveform at the VCSEL 12 and then run a batch fabrication on a wafer creating duplicates of that chosen imbalance, which wafer may then subsequently be machined into dies.

Another method of achieving a desired imbalance is by adjusting the values of the capacitor 72, the capacitor 78, the inductor 74, and/or the inductor 80. In the above described embodiment, the values of the capacitors 72, 78 and the inductors 74, 80 are identical or substantially identical to provide the same resistive and reactive impedance component to each output stage 56, 58. These circuit elements (72, 78, 74, 80), however, may be adjusted to be non-identical in capacitance and/or inductance in order to tune the drive circuit 42 to the desired performance.

In either of the two aforementioned methods of achieving a user-defined optimum performance, the present invention provides a way to avoid the problems of the impedance mismatch in the prior art, especially the frequency dependent mismatch above 1 GHz, the frequency range needed for wide bandwidth Gigabit Ethernet and Fibre Channel applications. By addressing these problems associated with wide bandwidth operation, manufacturers may now adjust, or tune, the other circuit elements, the contact leads 44, 48, the wire bond pads 46, 50, the capacitors 72, 78, and/or the inductors 74, 80 to further optimize performance of the VCSEL 12.

The die 10 (FIG. 2) and the drive circuit 42 (FIG. 3) can be used in numerous applications, as will be appreciated by persons of ordinary skill in the art from the above disclosure. In addition, the die 10 has the further advantage of being easily packaged into known VCSEL packages for use in gigabit switches, routers, hubs, end user terminations, etc. By way of example, not limitation, FIG. 4 shows an unassembled TO package 90 which includes a header 92 with four external wire leads 94, 96, 98, 100. The wire lead 94 connects the VCSEL 12 and the balancing load 14 to ground. The wire lead 96 connects the signal from output stage 56 to the VCSEL 12, and the wire lead 98 connects the signal from output stage 58 to the balancing load 14. The fourth wire lead 100 can be used for outputting the signal sensed by a photodetector 102, the signal of the photodetector 102 indicating the output power of the VCSEL 12 and being used in a feedback control to regulate power to the VCSEL 12 by circuitry not shown. The photodetector 102 can be a standard PN junction disposed on a support 104 to sense a portion of the VCSEL 12 output reflected by a partially reflective window 106 in a housing 108. The die 10 may also be disposed on the support 104, which may be formed of a non-conductive ceramic material, at a laser mounting portion 110 separated from a photodetector mounting portion 112 where the photodetector 102 can be disposed. The VCSEL 12 and the balancing load 14 on the die 10, along with the photodetector 102, can be connected to the wire leads 94, 96, 98, 100 by known means.

In an additional embodiment, the above teachings can be straightforwardly adapted into a laser array 120 (FIG. 5), substantially as die 10 except with a plurality of VCSELs 12 and balancing loads 14 disposed thereon. Conventionally, there are two techniques to drive such VCSEL arrays, common cathode or differentially. Under the common cathode drive, the entire substrate of a die acts as a common cathode for the VCSELs arrayed on the die, where individual anode connections are made to each VCSEL for driving each separately. In the conventional differential drive mode of VCSEL arrays, individual connections from the drive circuit exist to both the anode and the cathode. In this drive mode, there are two individual connections between the drive circuit and the die. One of the disadvantages of conventional VCSEL arrays is that fabrication is much more difficult, especially in the differential mode, and that series resistance of the device increases significantly for higher frequency drive signals.

Figure 5:
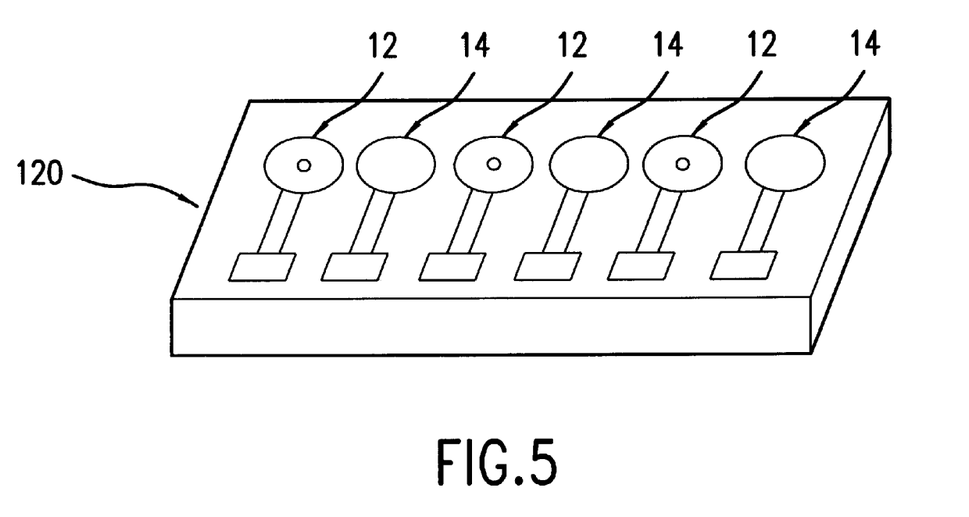
FIG. 5 is a perspective depiction of a laser array, in accordance with the teachings of the present invention.

The above teachings, however, with respect to die 10, when extended to the VCSEL array 120 comprising a plurality of VCSELs 12 and balancing loads 14, resolves the problems of these conventional VCSEL arrays because the differential drive circuit is terminated with a balancing load. The VCSELs 12 and balancing loads 14 may be coupled to the drive circuit 16 in parallel manner, or the pairs can each be individually connected to separate drive circuits, like drive circuit 16.

It will be appreciated by persons of ordinary skill in the art that the VCSEL laser array 120 could be more generally formed as a laser array with any differentially drivable semiconductor laser and that the laser array could be a linear array with multiple dies 10 in linear arrangement, essentially as shown, or a two-dimension array. Additionally, although the masking of balancing loads 14 is preferably like that of FIG. 2 as show in FIG. 5, various identical and non-identical masking techniques could be used to block output from the balancing loads 14, depending on the positioning of the balancing loads 14 on the laser array 120 or on user preferences. In fact, the balancing load 14 matched to the VCSEL 12, or other semiconductor, need not be positioned directly near the VCSEL 12, though preferably it would be so positioned.

Given the foregoing and from the following claims, persons of ordinary skill in the art will recognize that the embodiments described are provided only by way of example. Thus, the present invention can be extended to other semiconductor lasers, like edge-emitting lasers, other VCSEL lasers, like edge-emitting lasers with 45 degree vertical reflective mirror surfaces or tunable lasers using MEMS technology. Indeed, the principles disclosed herein can extend to other active circuit elements driven by two output stage drive circuits that rely on impedance matching at the two output stages, particularly those active elements that are traditionally batch fabricated and machined in a similar manner to semiconductor lasers. These and other embodiments are considered within the scope and spirit of the present invention.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A die having a semiconductor laser and a balancing load disposed thereon, the balancing load having an impedance that is substantially matched to the load impedance of the semiconductor laser, the semiconductor laser being driven by a drive circuit, and the balancing load coupled to the drive circuit to improve the drive circuit performance characteristics when driving the semiconductor laser.

2. The die of claim 1, wherein said semiconductor laser is a VCSEL with an emission window producing a photonic output.

3. The die of claim 2, wherein said balancing load comprises a VCSEL whereby the output of said balancing load VCSEL is blocked so as not to interfere with said photonic output.

4. The die of claim 1 having a plurality of said semiconductor lasers and a plurality of balancing loads disposed thereon, where for each semiconductor laser there is at least one balancing load having an impedance, including both resistive and reactive components, substantially matched to the load impedance of that semiconductor laser.

5. The die of claim 1, wherein each of said semiconductor lasers is a VCSEL with an emission window producing a photonic output, and wherein each of said balancing loads comprises a VCSEL whereby the output of said balancing load VCSEL is blocked so as not to interfere with said photonic output.

6. The die of claim 1, wherein said impedance of said balancing load is substantially identical to said impedance of said semiconductor laser for frequencies on the order of about 1 GHz.

7. The die of claim 1, wherein said semiconductor laser is coupled to a first contact path disposed on said die and wherein said balancing load is coupled to a second contact path disposed on said die.

8. The die of claim 7, wherein said first contact path and said second contact path have substantially the same dimensions and inductive and capacitive characteristics.

9. An apparatus comprising;
a drive circuit;
a VCSEL coupled to the drive circuit; and
a balancing load coupled to the drive circuit, wherein the balancing load has an impedance substantially matched to an impedance of the VCSEL at frequencies on the order of about 1 GHz.

10. The apparatus of claim 9, wherein the impedance of said VCSEL is substantially identical to the impedance of said balancing load at frequencies on the order of about 1 GHz.

11. The apparatus of claim 9, wherein said drive circuit is configured as a differential amplifier with a first output stage comprising a first transistor connected to said VCSEL and with a second output stage comprising a second transistor connected to said balancing load.

12. The apparatus of claim 11, wherein said first output stage comprises a first reactive circuit block connected to said first transistor and wherein said second output stage comprises a second reactive circuit block connected to said second transistor.

13. The apparatus of claim 12, wherein said first reactive circuit block and said second reactive circuit block have substantially the same impedance at frequencies on the order of about 1 GHz.

14. The apparatus of claim 11, wherein a non-inverted signal is input to said first transistor and an equivalent inverted input signal is input to said second transistor.

15. The apparatus of claim 9 having a plurality of said VCSELs coupled to said drive circuit and a plurality of said balancing loads coupled to said drive circuit, forming a laser array where for each VCSEL there is at least one balancing load having an impedance, including both resistive and reactive components substantially matched to the load impedance of that VCSEL.

16. A die having a semiconductor laser disposed thereon for producing a photonic output, said die also having a balancing load disposed thereon, the balancing load having an impedance, including both resistive and reactive components, substantially matched to a load impedance of said semiconductor laser, said balancing load not providing a photonic output.

17. The die of claim 16, wherein said semiconductor laser is a VCSEL with an emission window producing the photonic output, and wherein the balancing load does not have an emission window for producing a photonic output.

18. An apparatus comprising:
a drive circuit;
a VCSEL coupled to the drive circuit; and
a balancing load coupled to the drive circuit, wherein the balancing load has an impedance substantially matched to an impedance of the VCSEL, said balancing load not providing a photonic output.

19. An apparatus comprising:
an optoelectronic device;
a balancing load, the balancing load having an impedance that is substantially matched to an impedance of the optoelectronic device; and
a drive circuit coupled to the optoelectronic device and the balancing load, the drive circuit receiving an input signal that can assume a first state and a second state, the drive circuit being adapted to select the optoelectronic device and deselect the balancing load when the input signal is in the first state, and to deselect the optoelectronic device and select the balancing load when the input signal is in the second state.

20. The apparatus of claim 19 wherein the drive circuit includes a differential input that is adapted to receive a non-inverted input signal and an equivalent inverted input signal.

21. The apparatus of claim 19 wherein the impedance of the balancing load is substantially matched to the impedance of the optoelectronic device at frequencies on the order of 1 GHz or above.

22. The apparatus of claim 19 wherein the optoelectronic device is a first VCSEL device and the balancing load is a second VCSEL device.

23. The apparatus of claim 22 wherein the first VCSEL device includes an emission window, and the second VCSEL device does not include a corresponding emission window.

24. The apparatus of claim 19 wherein the optoelectronic device and the balancing load are positioned on a die, and the drive circuit is positioned off the die.

* * * * *